(12) United States Patent
Kawada et al.

(10) Patent No.: US 6,774,872 B1
(45) Date of Patent: Aug. 10, 2004

(54) FLAT DISPLAY DEVICE

(75) Inventors: Toyoshi Kawada, Kawasaki (JP);
Masami Aoki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/405,083

(22) Filed: Sep. 27, 1999

(30) Foreign Application Priority Data

Dec. 4, 1998 (JP) .......................................... 10-345941

(51) Int. Cl.⁷ ............................................... G09G 3/28
(52) U.S. Cl. ..................... 345/60; 345/204; 345/206; 345/68
(58) Field of Search ............................ 345/60, 94, 68, 345/76, 77, 204–206; 349/20, 32, 73; 361/687

(56) References Cited

U.S. PATENT DOCUMENTS

| | | | | |
|---|---|---|---|---|
| 5,063,327 A | * | 11/1991 | Brodie et al. ................ | 313/482 |
| 5,173,839 A | | 12/1992 | Metz, Jr. | |
| 5,235,451 A | | 8/1993 | Bryan | |
| 5,404,245 A | * | 4/1995 | Chahroudi .................... | 349/32 |
| 5,598,320 A | * | 1/1997 | Toedtman et al. .......... | 361/687 |
| 5,767,489 A | * | 6/1998 | Ferrier ......................... | 349/32 |
| 5,889,568 A | * | 3/1999 | Seraphim et al. ............. | 349/73 |
| 6,020,866 A | * | 2/2000 | Yamaguchi ................... | 345/86 |
| 6,081,306 A | * | 6/2000 | Nagano ........................ | 349/32 |
| 6,246,584 B1 | * | 6/2001 | Lee et al. .................... | 361/704 |
| 6,275,220 B1 | * | 8/2001 | Nitta ........................... | 345/204 |
| 6,288,896 B1 | * | 9/2001 | Hsu ........................... | 361/687 |

FOREIGN PATENT DOCUMENTS

| | | |
|---|---|---|
| CN | 182323 | 4/1992 |
| EP | 0 261 584 | 3/1988 |
| JP | 62-15584 | 1/1987 |
| JP | 6-34049 | 1/1988 |
| JP | 63-163885 | 7/1988 |
| JP | 2-7081 | 1/1990 |
| JP | 2-93425 | 4/1990 |
| JP | 2-248926 | 10/1990 |
| JP | 4-37724 | 2/1992 |
| JP | 4-116147 | 10/1992 |
| JP | 4-304427 | 10/1992 |
| JP | 8-181168 | 7/1996 |
| JP | 10-197854 | 7/1998 |
| JP | 10-214045 | 8/1998 |
| JP | 10-260641 | 9/1998 |
| JP | 10-333173 | 12/1998 |
| JP | 2000-56701 | 2/2000 |

* cited by examiner

*Primary Examiner*—Richard Hjerpe
*Assistant Examiner*—Kimnhung Nguyen
(74) *Attorney, Agent, or Firm*—Staas & Halsey LLP

(57) ABSTRACT

A flat display device includes a display panel, a driver integrated circuit chip provided adjacent to the display panel in electrical connection thereto, and a heat sink provided adjacent to the display panel, wherein the heat sink carries thereon the driver integrated circuit chip.

60 Claims, 12 Drawing Sheets

FLAT DISPLAY DEVICE

BACKGROUND OF THE INVENTION

The present invention generally relates to display devices and more particularly to a light-emitting display device including a plasma display device or an EL (electro-luminescence) display device.

A plasma display device or an EL (electro-luminescence) display device is a flat display device of the light-emission type. One important application of such light-emitting flat display devices is televisions having a very large screen size.

FIG. 1 shows the construction of a plasma display panel 10 of a so-called AC-type PDP (plasma display panel).

Referring to FIG. 1, the plasma display panel 10 includes rear-side glass substrate 11 and a front-side glass substrate 15, wherein the rear-side glass substrate 11 carries thereon a number of addressing electrodes 12 of a Cr/Cu/Cr stacked structure in the form of parallel bands extending in a column direction. Further, a dielectric layer 13 of a low-melting glass is deposited on the substrate 11 so as to cover the addressing electrode 12, and a rib structure 14 also of a low-melting glass is formed on the dielectric layer 13 such that the rib structure 14 includes a number of ribs each extending in the column direction such that a pair of the ribs are disposed at both lateral sides of each of the addressing electrodes 12. In the groove thus formed between a pair of the ribs, there is formed a layer of fluorescent material for the three primary colors of red (R), green (G) or blue (B), wherein the grooves for red, green and blue constitute together a single pixel.

On the front-side glass substrate 15, more precisely on the bottom principal surface of the front-side glass substrate 15 (see FIG. 1), there are provided a number of display electrodes 16 of a transparent conductive material such as ITO ($In_2O_3 \cdot SnO_2$) in the form of parallel bands, wherein each of the display electrodes 16 extends in a row direction, which is perpendicular to the column direction. Further, a bus electrode 17 of the Cr/Cu/Cr structure extends on each of the display electrodes with a width substantially smaller than a width of the display electrode 16, and there is formed a dielectric film 18 of a low-melting glass on the substrate 15 so as to cover the display electrodes 16 and the bus electrodes 17 thereon. Further, there is provided a protective film 19 of MgO on the dielectric film 18.

The glass substrate 11 and the glass substrate 15 having such a construction are assembled such that the ribs 14 on the glass substrate 11 face the protective film 19 on the glass substrate 15 as represented in FIG. 1, and an inert gas such as Ar is confined between the space formed between the substrate 11 and the substrate 15.

In operation, a drive voltage is applied between a selected addressing electrode 12 and a selected display electrode 17, and the plasma induced as a result of the drive voltage causes a light emission in the predetermined fluorescent layers.

Because of the active, light-emitting nature of the plasma display panel, a plasma display device that uses such a plasma display panel requires a power drive circuitry for driving the plasma display panel, wherein such a power drive circuitry of a plasma display panel consumes an electric power far larger than the electric power that is consumed by a drive circuit of a liquid crystal panel. The same applies true also in other active type flat display device such as the one that uses an ELP (electro-luminescent panel) for the display panel.

In such a light-emitting flat display device, it is required that the number of the addressing electrodes 12 and/or the displaying electrodes 16 has to be increased in order to improve the resolution of representation, while this means that it is necessary to provide the driver integrated circuit chips constituting the power drive circuitry along the peripheral part of the display device with an increased mounting density.

For example, it is necessary, in the case of designing a 42-inch full-color plasma display device that has a resolution of 850×480 pixels, to provide the addressing electrodes 12 in total of 2550 (=850×3; 850 for each of R, G and B), in addition to the display electrodes 16 provided with the number of 480. Thus, when the drive circuitry is formed by using the integrated circuit chips each having 60 output terminals, it is necessary to arrange 40 or more integrated circuit chips side by side in the lateral direction or row direction of the display panel. The number of the required integrated circuit chips increases further when a higher resolution is desired.

In view of the foregoing, various constructions are proposed for achieving the desired dense arrangement of the driver integrated circuit chips.

FIGS. 2 and 3 respectively show conventional constructions 20 and 20A for mounting the driver integrated circuit chips, wherein those parts in FIGS. 2 and 3 corresponding to the parts described previously are designated by the same reference numerals and the description thereof will be omitted.

Referring to FIG. 2 showing the construction 20 known as COB (chip-on-board), a driver integrated circuit chip is mounted directly on a printed circuit board for electrical interconnection. Thereby, the integrated circuit chips can be mounted with an increased density as compared with the case of mounting the same chips in the form accommodated in a package.

Referring to FIG. 2, the conventional construction 20 includes a printed circuit board 23 behind the glass substrate 11 and a driver integrated circuit chip 21 mounted on the printed circuit board 23, wherein the printed circuit board 23 is connected electrically to the addressing electrodes 12 or the bus electrodes 17 on the glass substrate 11 or on the glass substrate 15 via a flat cable 22'.

In the construction 20 of FIG. 2, the driver integrated circuits can be mounted on the printed circuit board 23 with high density. On the other hand, the printed circuit board 23 has a poor thermal conductivity due to the material used therefor, and because of this, the construction 20 has a drawback of poor heat dissipation. Thus, in the construction 20, there is a problem in that not only the driver integrated circuit chip 21 but also the printed circuit board 23 itself experiences a severe temperature rise, while such a severe temperature rise of the printed circuit board 23 raises a question with regard to the reliability of the printed circuit 23 itself or with regard to the reliability of other driver integrated circuits held on the printed circuit board 23.

On the other hand, the construction 20A of FIG. 3 is known as COG (chip-on-glass), which is under investigation particularly with regard to the art of liquid crystal display device for a high density mounting of the driver integrated circuit chips with reduced thickness. In the field of the liquid crystal display devices, there are reports that the COG construction 20A is used in practice.

Referring to FIG. 3, it should be noted that the driver integrated circuit chip 21 is attached to the glass substrate 11, and the driver integrated circuit 21 thus mounted on the substrate 11 is connected to the addressing electrodes 12 or to the bus electrodes 17 via bonding wires 21a and a flat cable 22. In the illustrated example, the flat cable 22 carries a connector 22A at a tip end thereof, and the connector 22A is used to electrically connect the flat cable 22 to the printed circuit board 23 that is provided at the rear side of the substrate 11. The printed circuit board 23 may carry integrated circuit chips 24 and 25 containing therein various control circuits.

In the construction 20A of FIG. 3, it should be noted that the driver integrated circuit chips 21 are aligned on the glass substrate along the edge part thereof with a large mounting density. In such a structure of FIG. 3, the dissipation of heat from the driver integrated circuit chips 21 thus arranged on the glass substrate 11 becomes inevitably poor in view of the poor thermal conductivity of the glass substrate 11. Thus, there may occur a severe temperature rise in the driver integrated circuits 21, which may lead the integrated circuit 21 to malfunction or to be damaged. Further, the heat thus transferred to the glass substrate 11 or 15 may induce a distortion in the plasma display panel 10. In the worst case, the plasma display panel 10 may be damaged.

SUMMARY OF THE INVENTION

Accordingly, it is a general object of the present invention to provide a novel and useful light-emitting flat display device wherein the foregoing problems are eliminated.

Another and more specific object of the present invention is to provide a light-emitting flat display panel wherein the efficiency of heat dissipation is improved substantially.

Another object of the present invention is to provide a flat display device, comprising:

a display panel;

a driver integrated circuit chip provided adjacent to said display panel in electrical connection thereto; and a heat sink provided adjacent to said display panel, said heat sink carrying thereon said driver integrated circuit chip.

According to the present invention, the problem of heat dissipation, which arises in the high-resolution flat display device in which the driver integrated circuit chips have to be mounted with large density, is successfully avoided by forming the driver integrated circuit chips on a heat sink block.

Other objects and further features of the present invention will become apparent from the following detailed description when read in conjunction with the attached drawings.

DETAILED DESCRIPTION OF THE PREFERRED EMBODIMENTS

Figure 1:
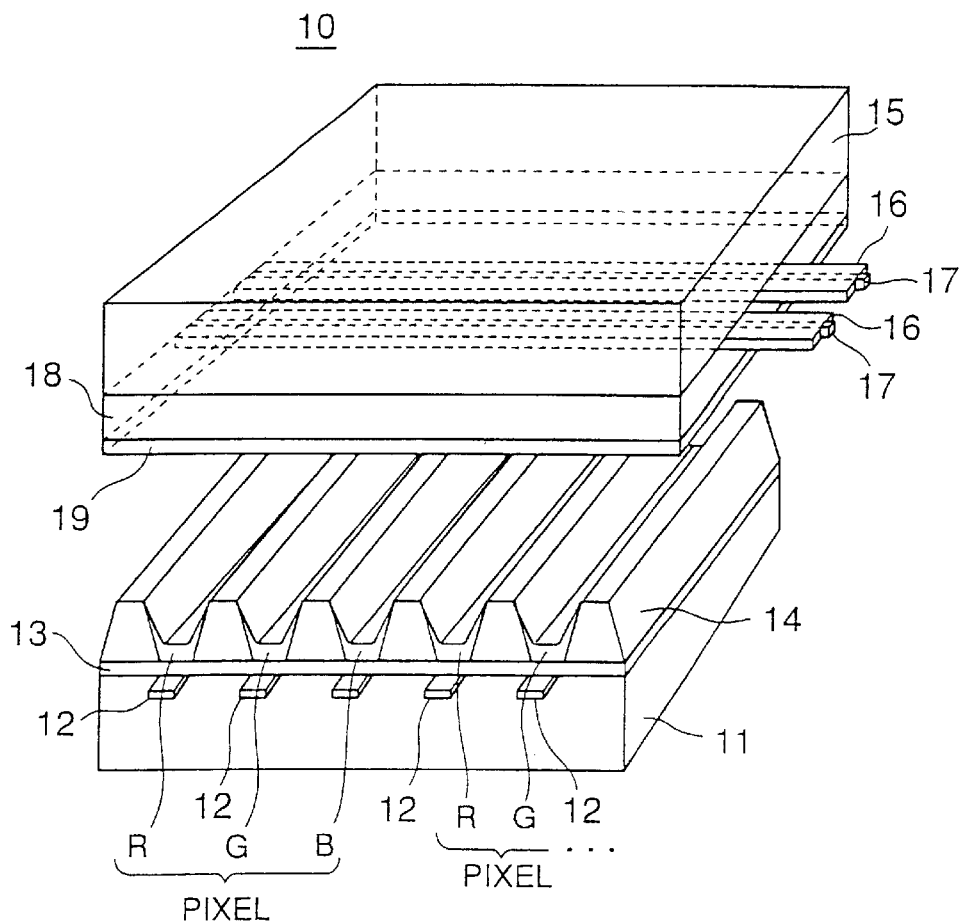
FIG. 1 is a diagram showing the construction of a conventional plasma display panel.
Figure 2:
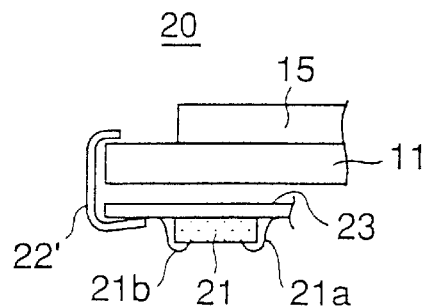
FIG. 2 is a diagram showing the construction of a driving part of a conventional plasma display device.
Figure 3:
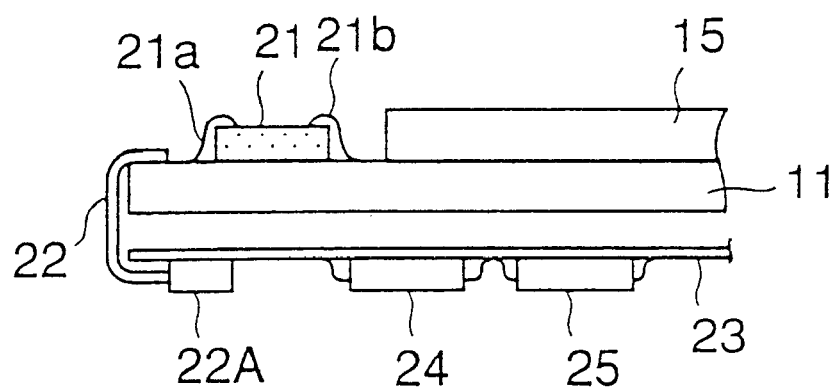
FIG. 3 is a diagram showing the case in which a driving construction, used conventionally in liquid crystal display devices, is applied to a plasma display device.

FIGS. 4A–4D explain the principle of the present invention, wherein those parts corresponding to the parts described previously are designated by the same reference numerals and the description thereof will be omitted.

Figure 4A:
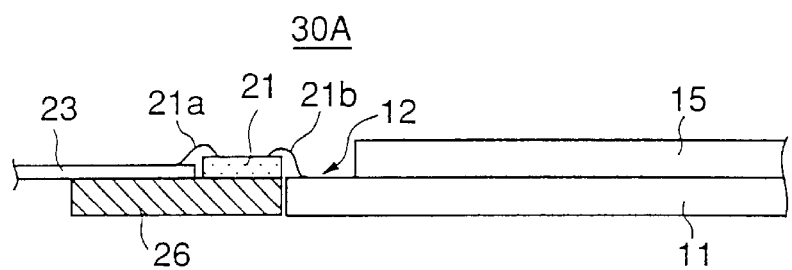
FIGS. 4A–4D are diagrams explaining the principle of the present invention.

Referring to FIG. 4A showing a plasma display 30A according to the present invention, there is disposed a heat sink block 26 of a heat-conductive metal such as Al adjacent to the plasma display panel including the substrates 11 and 15, and the driver integrated circuit chip 21 is mounted upon the heat sink 26. By mounting the driver integrated circuit chip 21 on such a heat sink block 26 rather than on the glass substrate 11, which has an inferior thermal conductivity, the heat generated by the driver integrated circuit chip 21 is absorbed efficiently by the heat sink block 26 and is radiated to the environment. The temperature rise of the driver integrated circuit chip 21 is thus effectively suppressed.

In the example of FIG. 4A, the integrated circuit chip 21 is electrically connected to the electrodes 12 or 17 on the substrate 11 or 15 by way of wire bonding, or the like. Further, the heat sink block 26 carries thereon the printed circuit board 23, which may be a flexible printed circuit board.

Figure 4B:
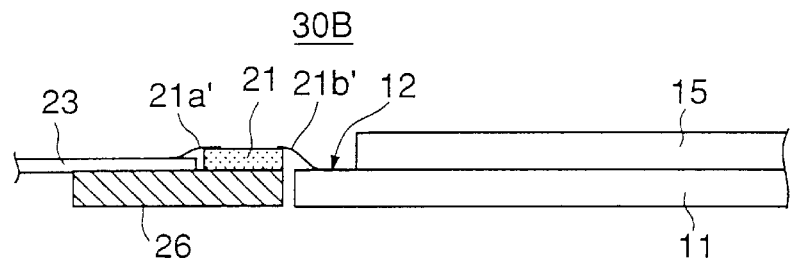
Figure 4C:
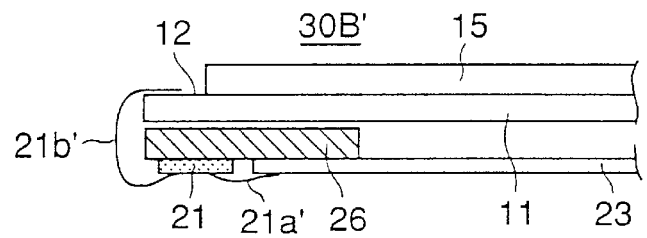

FIGS. 4B and 4C show plasma display devices 30B and 30B', respectively, wherein the plasma display device 30B of FIG. 4B has a construction substantially identical with that of the plasma display device 30A of FIG. 4A, except that the driver integrated circuit chip 21 on the heat sink block 26 is connected electrically to the plasma display panel and to the printed circuit board 23 by way of TAB lead 21a' or 21b'. In the case of the plasma display device 30B of FIG. 4B, it should be noted that the sink block 26 is provided adjacent to the edge part of the glass substrate 11. Thereby, the heat sink block 26 may be provided in contact engagement with the glass substrate 11 or may be adhered thereto.

In the case of the construction 30B' of FIG. 4C, the heat sink block 26 is provided at the rear side of the glass substrate 11. Thereby, the driver integrated circuit chip 21, mounted on the heat sink block 26, is located also at the rear side with respect to the electrodes 12 on the glass substrate 11 in the construction 30B' of FIG. 4C. In the construction 30B' of FIG. 4C, the TAB lead 21b' is formed with an increased length so that the TAB lead 21b' extends from the rear side of the glass substrate 11 to the front side of the glass substrate 15.

Figure 4D:
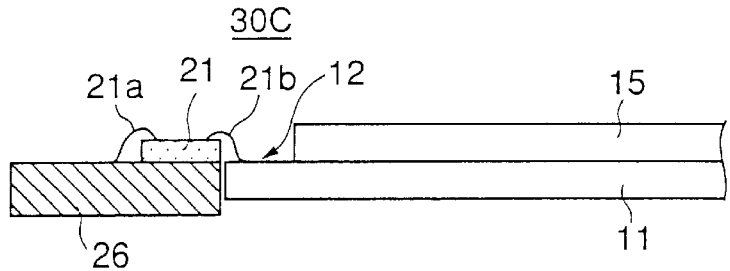

FIG. 4D shows another example 30C of the plasma display device of the present invention in which there is provided an interconnection pattern corresponding to the interconnection pattern on the printed circuit board 23, such that the interconnection pattern is now provided on the heat sink block 26. In the example of FIG. 4D, the heat sink 26 is formed of a metal block and an insulation film covering the metal block, and the foregoing interconnection pattern is provided on such an insulation film. Similarly to the construction of FIG. 4D, the heat sink block 26 may be provided in contact engagement with the glass substrate 11 and in adherence therewith.

Figure 5A:
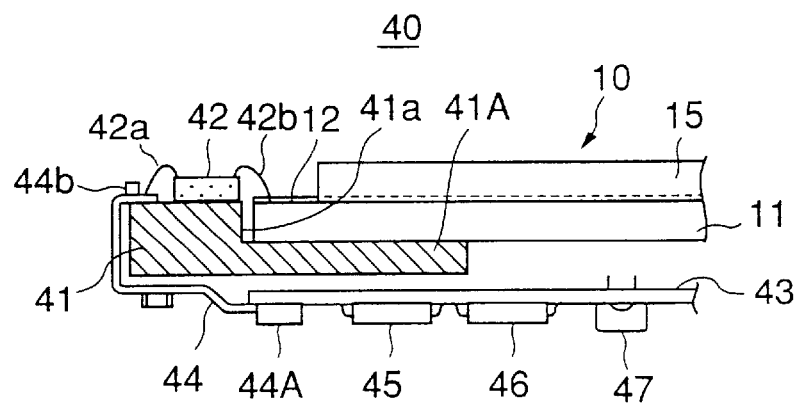
FIGS. 5A and 5B are diagrams showing the construction of a plasma display device according to a first embodiment of the present invention.
Figure 5B:
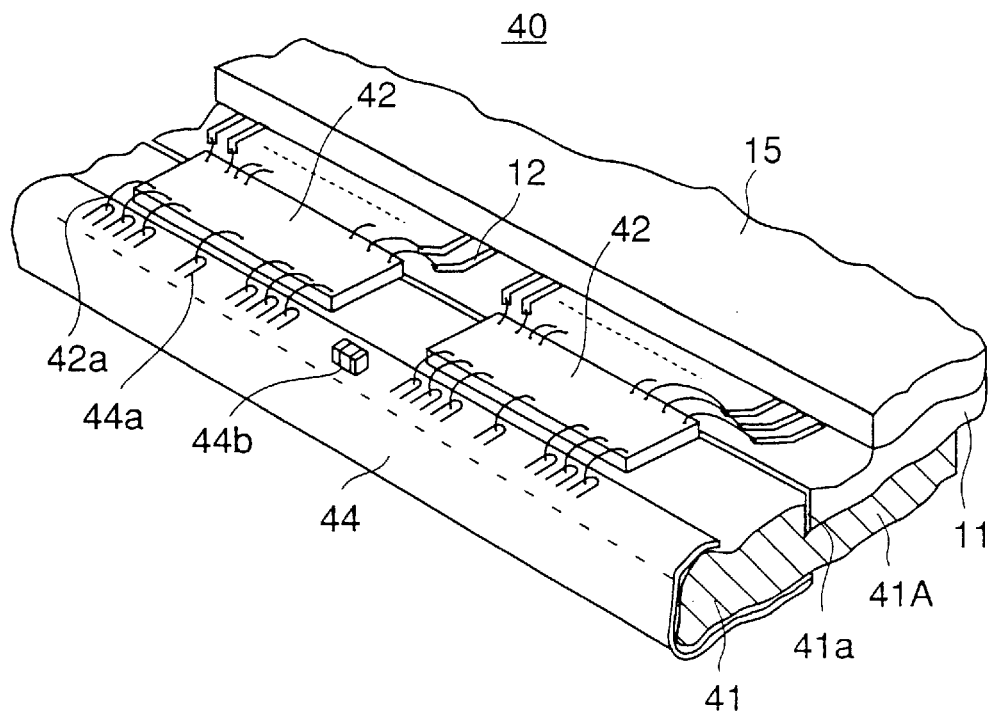

FIGS. 5A and 5B show the construction of a plasma display device 40 according to a first embodiment of the present invention respectively in a cross-sectional view and an oblique view, wherein those parts corresponding to the parts described previously are designated by the same reference numerals and the description thereof will be omitted.

Referring to FIGS. 5A and 5B, the plasma display device 40 includes, in addition to the plasma display panel 10 having the construction of FIG. 1, a printed circuit board 43 disposed behind the plasma display panel 10, wherein the printed circuit board 43 carries thereon various controller integrated circuit chips 45 and 46 corresponding to the foregoing integrated circuit chips 24 and 25. The printed circuit board 43 may further carry thereon passive devices such as a capacitor 47. Further, the plasma display device 40 includes a heat sink block 41 of Al such that the heat sink block 41 engages a side edge part of the plasma display panel 10, more specifically the side edge of the glass substrate 11, and the driver integrated circuit chip 42 of the plasma display panel 40 is adhered or soldered upon the heat sink block 41.

In the illustrated example, the driver integrated circuit chip 42 is electrically connected to the addressing electrodes 12 on the glass substrate 11 via bonding wires 42b and further to the flexible printed circuit board 43 via a flexible printed circuit board or a flat cable 44 and a connector 44A, wherein the interconnection between the driver integrated circuit chip 42 and the flexible printed circuit board 44 is achieved by other bonding wires 42a. The flexible printed circuit board 44 may be formed on a polyimide film base and may carry a chip capacitor 44b. The flexible printed circuit board 44 is used to supply control signals and electrical power to the driver integrated circuit 42. As noted already, a flexible flat cable may be used for the foregoing flexible printed circuit board 44.

As represented in FIGS. 5A and 5B, the foregoing heat sink block 41 may have a guide part 41A adapted for engagement with the rear surface of the glass substrate 11, wherein the guide part 41A includes a stepped part 41a used as a positioning part. Thus, the heat sink block 41 is mounted on the glass substrate 11 such that the rear side of the glass substrate 11 engages the guide part 41A of the heat sink block 41 and such that the side edge of the glass substrate 11 engages the foregoing positioning stepped part 41a of the guide part 41A. Thereby, the heat sink block 41 is fixed upon the glass substrate 11 by an adhesive layer. The adhesive layer may be admixed with a metal filler for improving the thermal conductivity. Typically, the heat sink block 41 is formed from an Al block of about 5 mm in thickness and of about 70 mm in width, by machining the stepped part 41a. Thereby, it is preferable to form the stepped part 41a to have a height generally equal to or slightly smaller than the thickness of the glass substrate 11. By doing so, the difference in level between the top surface of the chip 42 and the top surface of the glass substrate 11, on which the addressing electrodes 12 are provided, is reduced and the length of the bonding wires 42b is minimized.

In the illustrated example of FIGS. 5A and 5B, the electrode pads are formed on the driver integrated circuit chip 42 with a pitch smaller than the pitch of the addressing electrodes 12 on the glass substrate 11, and because of this, the integrated circuit chip 42 has a width smaller than the width of the region that includes the corresponding addressing electrodes 12. Thus, when the addressing electrodes 12 are formed on the glass substrate 11 with a reduced pitch, there may be a case in which the width of the integrated circuit chip 42 becomes more or less equal to the width of the region that includes the addressing electrodes 12 to be connected to the integrated circuit chip 42.

The bonding of the wires 42a or 42b to the integrated circuit chips 42 may be conducted either consecutively one chip by one chip, or simultaneously to the entire chips 42. In the latter case, the bonding of the wires 42a may be conducted simultaneously to the entire chips 42 and then the bonding of the wires 42b, or vice versa. This latter approach is particularly useful in the case the bonding condition has to be changed between the wire 42a and the wire 42b.

It should noted that the driver integrated circuit chips 42 are formed along the horizontal edge of the plasma display panel 10 when the integrated circuit chips 42 are used to drive the addressing electrodes 12. In the case of realizing the resolution of 850×480, more than forty driver integrated circuit chips 42 are arranged along the horizontal axis in electrical connection with the addressing electrodes 12.

According to the present embodiment, the heat generated by the driver integrated circuit chip 42 is absorbed immediately by the heat sink block 41 and is radiated to the environment from the heat sink block 41. Thereby, the temperature rise of the driver integrated circuit 42, and hence the temperature rise of the plasma display panel 10 itself, is effectively avoided. It should be noted that the present invention is particularly useful in the high-resolution plasma display devices in which a large number of driver integrated circuit chips are arranged with a large density, for suppressing the temperature rise of the plasma display panel. Thereby, it should be noted that the guide part 41A of the heat sink block 41 function as a heat radiating surface at the rear side of the glass substrate 11. The size of the guide part 41A may be optimized depending on the number of the driver integrated circuit chips provided on the glass substrate 11 or on the expected heating.

After the wire bonding process of the bonding wires 42a and 42b, the driver integrated circuit chips 42 are potted, together with the bonding wires 42a and 42b.

Figure 6A:
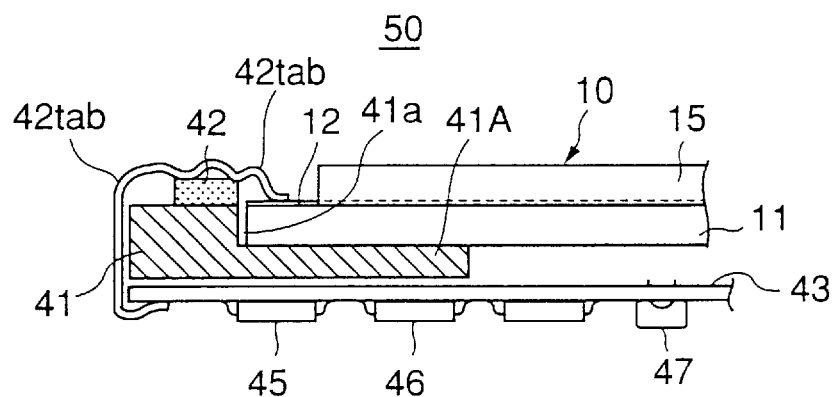
FIGS. 6A and 6B are diagrams showing the construction of a plasma display device according to a second embodiment of the present invention.
Figure 6B:
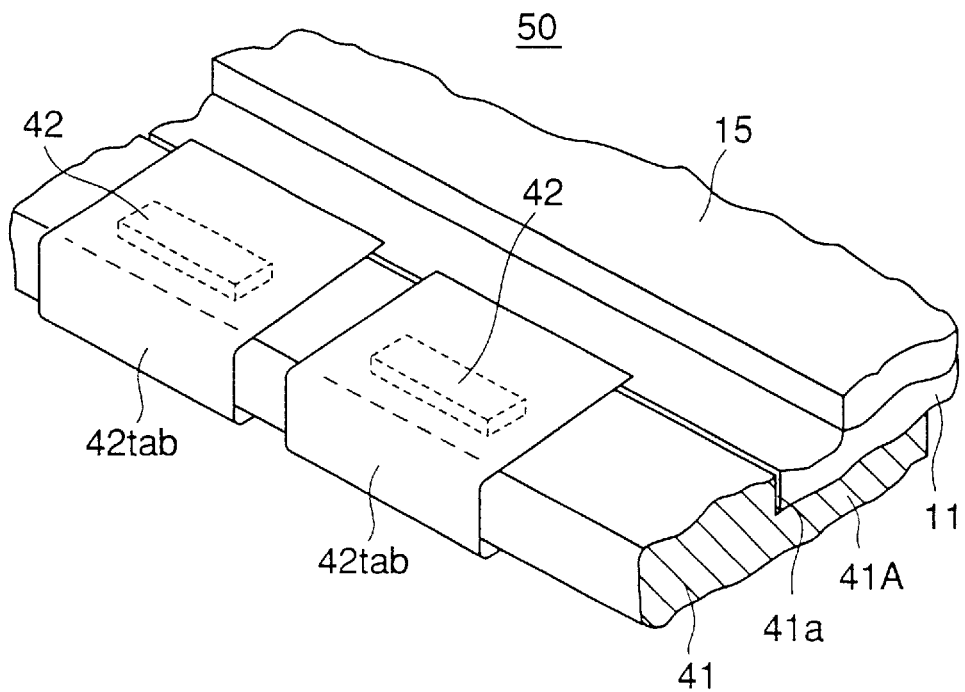

FIGS. 6A and 6B show the construction of the plasma display device 50 according to a second embodiment of the present invention wherein those parts corresponding to the parts described previously are designated by the same reference numerals and the description thereof will be omitted.

Referring to FIGS. 6A and 6B, the plasma display device 50 of the present embodiment has a construction similar to that of the plasma display device 40 of FIGS. 5A and 5B, except that a TAB lead $42_{tab}$ is used in place of the bonding wires 42a and 42b for interconnecting the driver integrated circuit chip 42 to the plasma display panel 10 and to the printed circuit board 43.

As represented in the oblique view of FIG. 6B, the TAB lead $42^{tab}$ is provided in correspondence to each of the driver integrated circuit chips 42 so as to cover the chip 42.

By using the TAB lead $42_{tab}$ in place of the bonding wires 42a and 42b, a simultaneous electrical interconnection is made to the bonding pads on the chip 42, and the efficiency of production of the plasma display device is improved.

As other features of the present embodiment are substantially the same as those of the previous embodiments, further description thereof will be omitted.

Figure 7A:
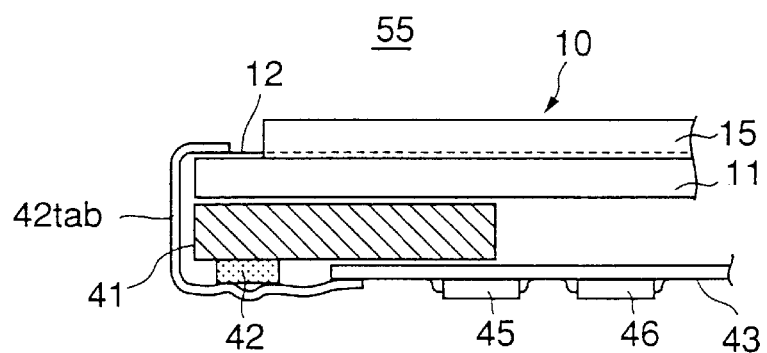
FIGS. 7A and 7B are diagrams showing the construction of a plasma display device according to a modification of the second embodiment of the present invention.
Figure 7B:
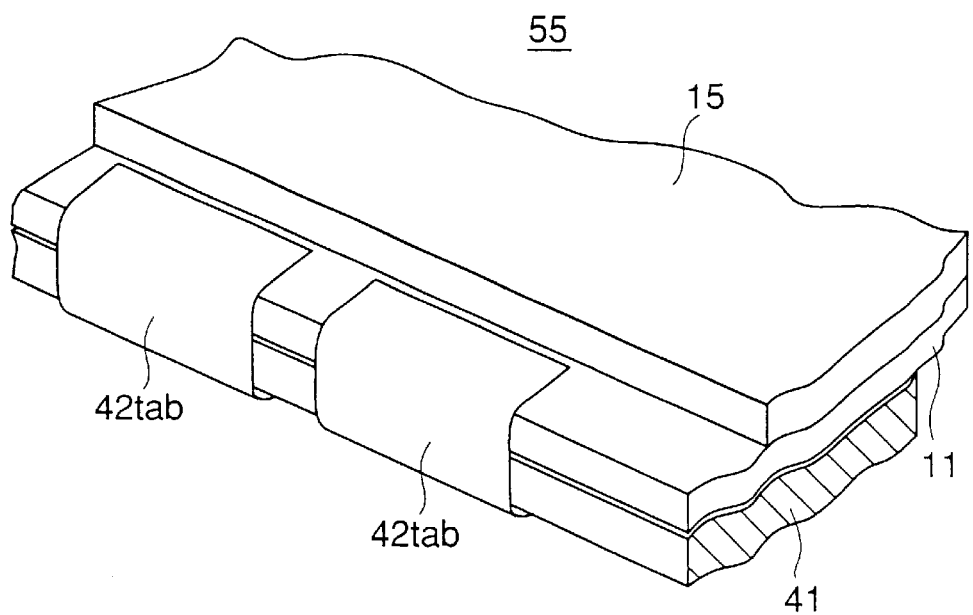

FIGS. 7A and 7B show the construction of a plasma display device 55 according to a modification of the plasma display device 50 of the present embodiment, wherein those parts corresponding to the parts described previously are designated by the same reference numerals and the description thereof will be omitted.

Referring to FIGS. 7A and 7B, the plasma display device 55 includes the heat sink block 41 at the rear side of the glass substrate 11, wherein the rear side is the side opposite to the side on which the addressing electrodes 12 are formed. According to the construction of FIGS. 7A and 7B, a rectangular block of Al, having a size of about 5 mm in thickness and about 50 mm in width, for example, is adhered upon the foregoing rear side of the glass substrate 11 along the edge part thereof.

In the construction of FIGS. 7A and 7B, the driver integrated circuit chip 42 is mounted on the surface of the heat sink block 41 provided on the rear side of the glass substrate 11, wherein the electrical interconnection of the driver integrated circuit chip 42 to the addressing electrodes 12 is achieved by the TAB lead $42_{tab}$. The TAB lead $42_{tab}$ is formed to have an increased length larger than the sum of the thicknesses of the heat sink block 41 and the glass substrate 11, such that the TAB lead $42_{tab}$ successfully reaches, from the driver integrated circuit chip 42 on the block 41, to the addressing electrodes 12 on the glass substrate 11 via a curved path.

In the plasma display device 55 of the present embodiment, there is no laterally projecting parts that project beyond the lateral edge of the glass substrate 11, contrary to the plasma display device 40 or 50 explained previously. Thereby, the plasma display device 55 of the present embodiment can be formed with a reduced lateral size.

As other features of the present embodiment are substantially the same as those of the previous embodiments, further description thereof will be omitted.

Figure 8:
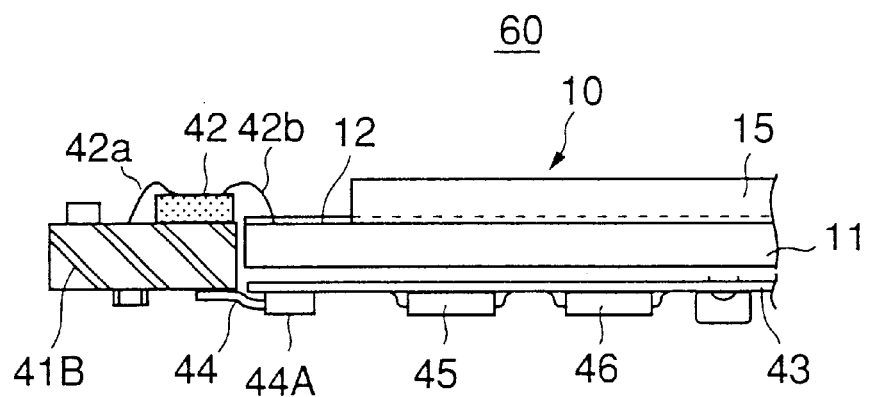
FIG. 8 is a diagram showing the construction of a plasma display device according to a third embodiment of the present invention.

FIG. 8 shows the construction of a plasma display device 60 according to a third embodiment of the present invention, wherein those parts corresponding to the parts described previously are designated by the same reference numerals and the description thereof will be omitted.

Referring to FIG. 8, the plasma display device 60 includes, in addition to the plasma display panel 10 described previously, a heat sink block 41B including therein an electrical interconnection structure, such that the heat sink block 41B is attached to the edge part of the glass substrate 11 constituting the plasma display panel 10 by an adhesive. The heat sink block 41B carries thereon the driver integrated circuit chip 42 in the state that the driver integrated circuit chip 42 is connected electrically to the plasma display panel 10 by way of bonding wires 42b. As will be described later with reference to other embodiments, the heat sink block 41B includes a metal core of Al, and the like, wherein the metal core is covered with an insulation film, and an interconnection pattern is formed in the insulation film.

In the construction of FIG. 8, it should further be noted that the heat sink block 41B is connected electrically to the printed circuit board 43 disposed at the rear side of the glass substrate 11 via a flat, flexible cable, which may be the flexible printed circuit board 44 including the connector 44A.

In the present embodiment, the heat sink block 41B itself has the function of an interconnection substrate including a power supply system. Thus, it is no longer necessary to provide a separate signal wiring or power wiring for the signals or electric power to be supplied to the driver integrated circuit chip 42. Thereby, the number of the parts of the plasma display device can be reduced. Further, the construction of the present embodiment provides an additional advantageous feature in that the interconnection between the printed circuit board 43 and the heat sink block 41B is made easily by using a short cable for the flexible flat cable 44.

Figure 9:
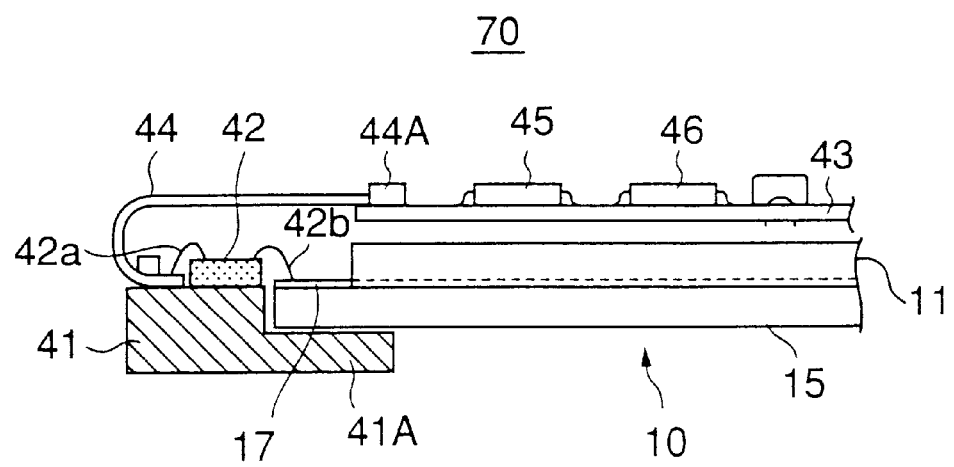
FIG. 9 is a diagram showing the construction of a plasma display device according to a fourth embodiment of the present invention.

FIG. 9 shows a plasma display device 70 according to a fourth embodiment of the present invention, wherein those parts corresponding to the parts described previously are designated by the same reference numerals and the description thereof will be omitted.

Referring to FIG. 9, the plasma display device 70 is a modification of the plasma display device 40 of FIGS. 5A and 5B in which the heat sink block 41 is used for heat dissipation of the driver integrated circuit chip 42 that is connected to the bus electrodes 17 on the glass substrate 15. In the construction of FIG. 9, the heat sink blocks 41 are formed along the vertical edges of the plasma display panel 10.

In the construction of FIG. 9, it should be noted that the plasma display panel 70 is provided upside-down as compared with the case of the plasma display device explained heretofore, and thus, the upper glass substrate 15 extends laterally over the lower glass substrate 10. Further, it can be seen that the heat sink block 41 having the guide part 41A is provided in engagement with the side edge of the glass substrate 15. Further, the driver integrated circuit chip 42 is mounted on the heat sink block 41 in electrical connection with the bus electrodes on the glass substrate 15 via the bonding wires 42b.

In the case of the 42-inch plasma display device having the resolution of 850×480 explained before, it is noted that eight of such driver integrated circuit chips 42 are provided along the vertical edge of the plasma display panel.

The construction of FIG. 9 can be regarded as a modification of the plasma display device 40 explained with reference to FIGS. 5A and 5B. In this case, as the printed circuit board 43 is disposed in the same direction to the driver integrated circuit chip 42, which is mounted on the heat sink block 41, the flexible printed circuit borad 44 forms a curved path over the driver integrated icrcuit chip 42 such that the flexible printed circuit board 44 successfully connects the printed circuit board 43 to the drive integrated circuit chip 42.

Figure 10A:
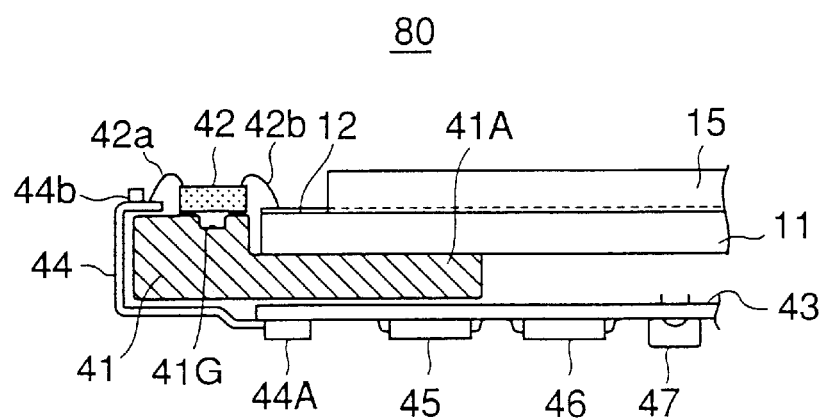
FIGS. 10A and 10B are diagrams showing the construction of a plasma display device according to a fifth embodiment of the present invention.
Figure 10B:
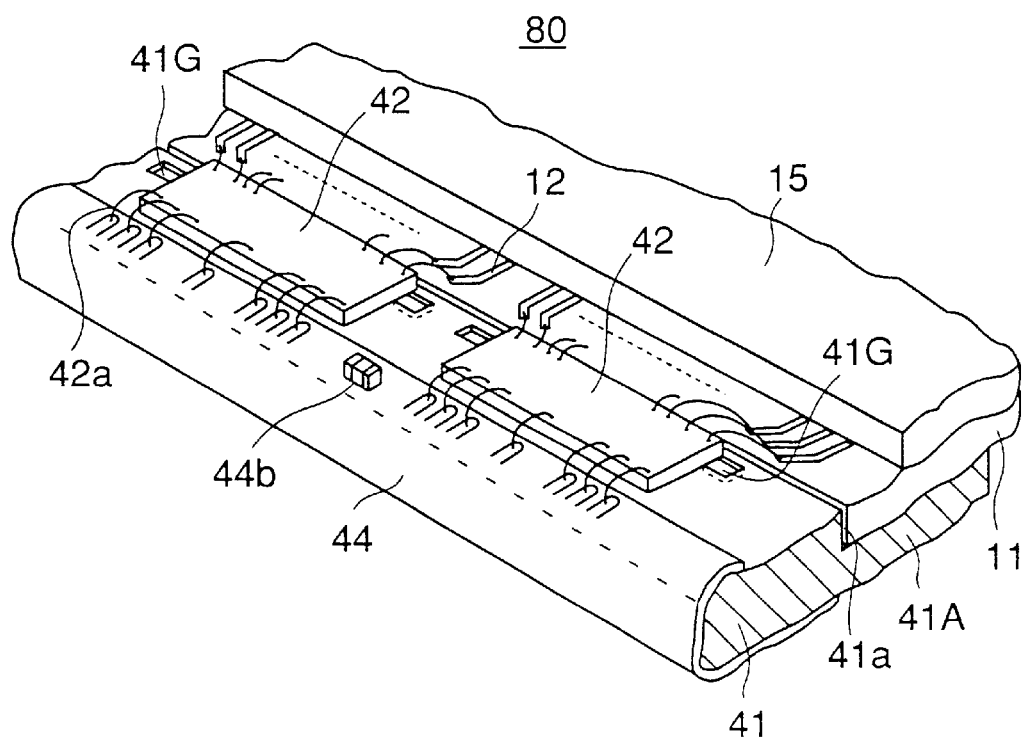

FIGS. 10A and 10B show the construction of a plasma display device 80 according to a fifth embodiment of the present invention respectively in a cross-sectional view and a plan view, wherein those parts corresponding to the parts described previously are designated by the same reference numerals and the description thereof will be omitted.

Referring to FIGS. 10A and 10B, the plasma display device 80 of the present embodiment has a construction substantially identical with the construction of the plasma display device 40 of FIGS. 5A and 5B, except that there is formed a groove 41G in the heat sink block 41 in a part located right underneath the driver integrated circuit chip 42.

In the production of plasma display devices, the driver integrated circuit chips are generally tested before mounting on the plasma display device. However, there can be a case in which a defect may be caused even when a defect-free integrated circuit chip is used, as a result of various reasons including mishandling of the integrated circuit chip. Thus, it is necessary to examine the driver integrated circuit chip after mounting the same on the actual plasma display panel, by feeding thereto a test signal.

In such an in-situ testing of the driver integrated circuit, it is desirable that the tested integrated circuit can be replaceable in the case it is judged that the driver integrated circuit is defective. The construction of FIGS. 10A and 10B allows such a replacement of the driver integrated circuit 42 mounted already on the heat sink block 41, by inserting a tool into the foregoing groove 41G.

Figure 11:
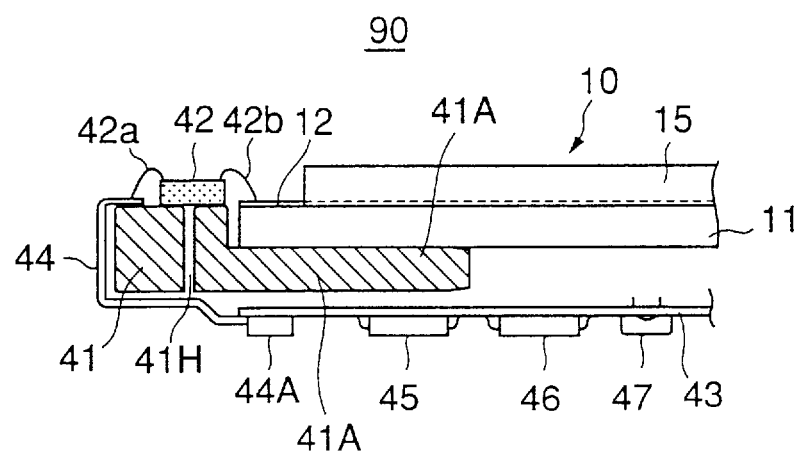
FIG. 11 is a diagram showing the construction of a plasma display device according to a sixth embodiment of the present invention.

FIG. 11 shows the construction of a plasma display device 90 according to a sixth embodiment of the present invention in a cross-sectional view wherein those parts corresponding to the parts described previously are designated by the same reference numerals and the description thereof will be omitted.

Referring to FIG. 11, the plasma display device 90 of the present embodiment has a construction substantially identical with that of the plasma display device 40 of FIGS. 5A and 5B, except that there is formed a penetrating hole 41H in the heat sink block 41 in the part on which the driver integrated circuit 42 is mounted.

The penetrating hole 41H is provided for the purpose similar to that of the groove 41G of the previous embodiment and is used to dismount the driver integrated circuit chip 42 when it is judged defective as a result of the test of the plasma display device conducted in the state that the driver integrated circuit chip 42 is mounted on the heat sink block 41. Such a dismounting of the driver integrated circuit chip 42 is achieved easily by inserting a pin into the foregoing penetrating hole 41H and by urging the chip 42 at the rear surface thereof.

Figure 12:
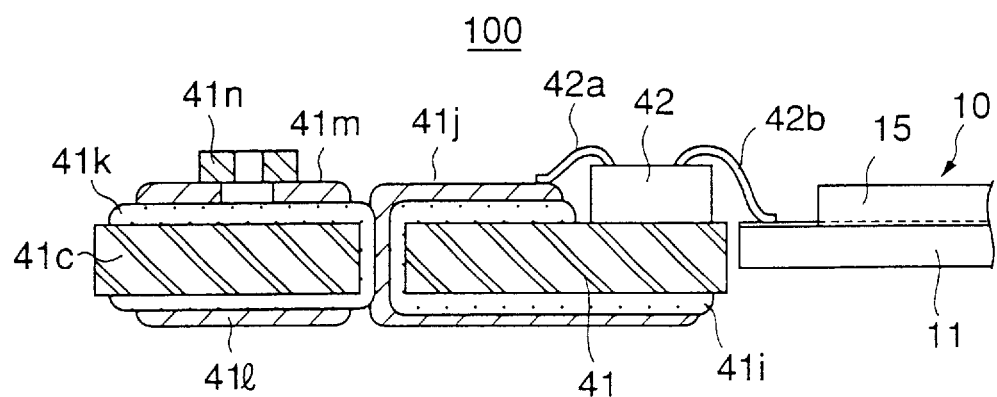
FIG. 12 is a diagram showing the construction of a plasma display device according to a seventh embodiment of the present invention.

FIG. 12 shows the construction of a plasma display device 100 according to a seventh embodiment of the present invention, wherein those parts corresponding to the parts described previously are designated by the same reference numerals and the description thereof will be omitted.

Referring to FIG. 12, the plasma display device 100 is a modification of the plasma display device 60 of FIG. 8 and includes the heat sink block 41 of Al adhered to the glass substrate 11 constituting the plasma display panel 10 in contact engagement therewith. Similarly to the plasma display device 60, the heat sink block 41 carries thereon the driver integrated circuit chip 42. The heat sink block 41 is covered by an insulation film 41i of $Al_2O_3$, and the like, and an interconnection pattern 41j is formed on the insulation film 41i.

In the construction of FIG. 12, there is formed another heat sink block 41C of Al adjacent to the heat sink block 41, wherein the heat sink block 41C is covered by an insulation film 41k similar to the insulation film 41i. Further, there is formed another interconnection pattern 41l or 41m on the insulation film 41k similarly to the interconnection pattern 41j. In the example of FIG. 12, a chip capacitor 41n is formed on the heat sink block 41C.

In the plasma display device 100 of FIG. 12, it should be noted that the printed circuit board 43 is eliminated, and the function of the printed circuit board 43 is now achieved by the heat sink blocks 41 and 41C.

Figure 13:
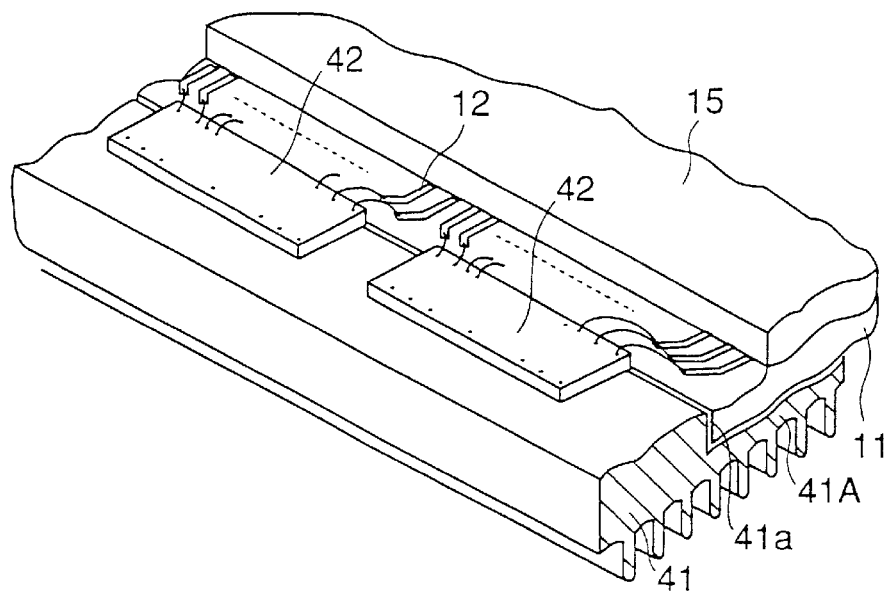
FIG. 13 is a diagram showing the construction of a plasma display device according to a further embodiment.
Figure 14:
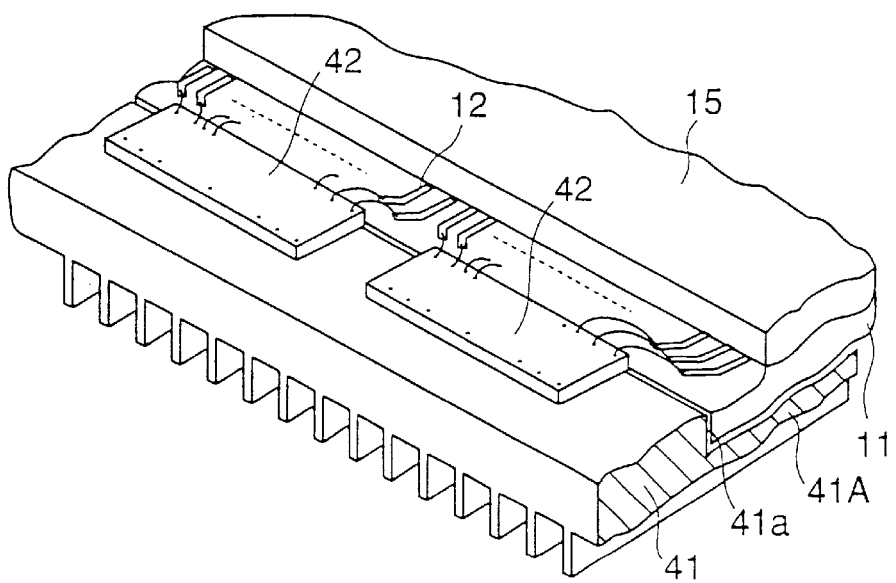
FIG. 14 is a diagram showing the construction of a plasma display device according to a further embodiment.

FIGS. 13 and 14 show the construction of a plasma display device according to further embodiments of the present invention, wherein the embodiments of FIGS. 13 and 14 are modifications of any of the first through seventh embodiments of the present invention described heretofore, in which the heat sink block 41 is now provided with cooling fins 41a. By providing the cooling fins 41a, the efficiency of heat dissipation of the plasma display device is improved further. In the embodiment of FIG. 13, the cooling fins 41a extend in a elongated direction of the heat sink block 41, while the cooling fins 41a of FIG. 14 extend in the direction perpendicular to the elongated direction of the heat sink block 41.

Figure 15A:
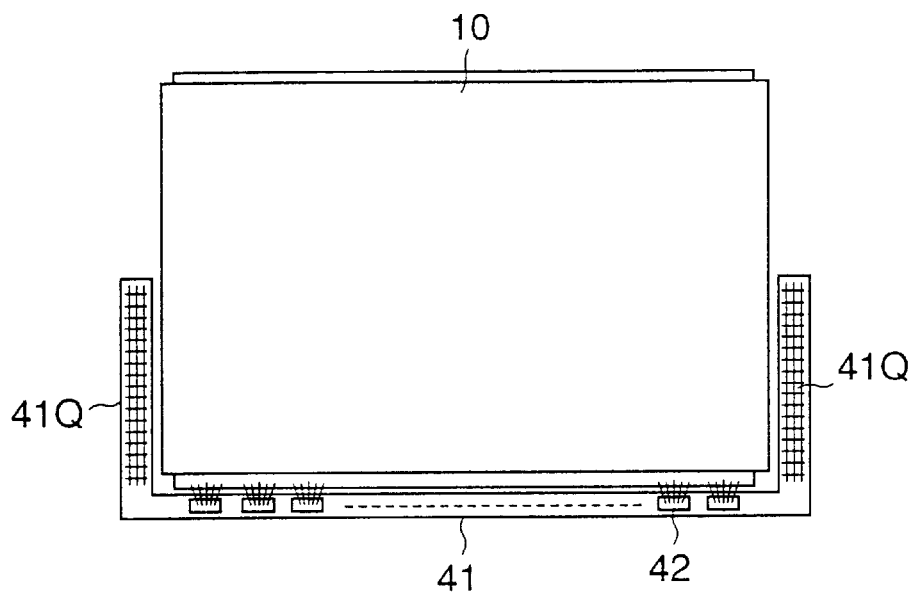
FIGS. 15A and 15B are diagrams showing the construction of a plasma display device according to further embodiments.
Figure 15B:
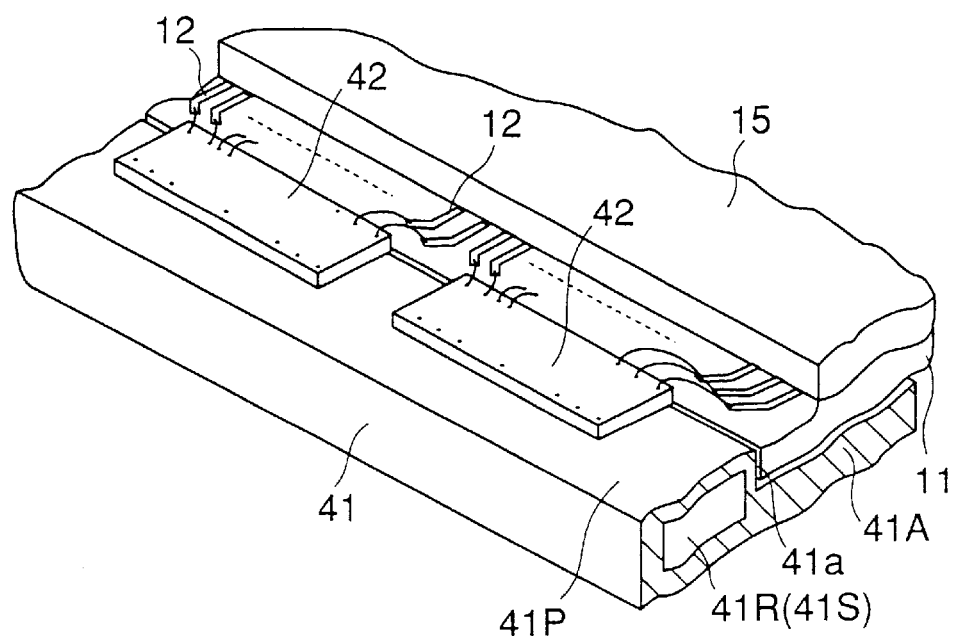

FIGS. 15A and 15B show the construction of a plasma display device according to a further embodiment of the present invention respectively in a plan view and in an oblique view, wherein the efficiency of cooling is enhanced further by providing a heat exchanger in the heat sink block 41.

More specifically, the embodiment of FIGS. 15A and 15B uses a heat pipe for the heat exchanger. A heat pipe is a cooling mechanism that uses a coolant for removing heat. Thus, a heat pipe includes an enclosed passage of the coolant formed in a thermally conductive material such as aluminum, and causes to flow the coolant through such an enclosed passage. A heat pipe is effective for transporting the heat of a heat source to a distant location for radiation.

Referring to FIGS. 15A and 15B, the heat sink block 41 carrying thereon the driver integrated circuit 42 includes a heat absorbing part 41P constituting the heat pipe mechanism, wherein there is formed a passage 41R of a coolant 41S in the heat sink block 41 in correspondence to the foregoing heat absorbing part 41P, and the coolant 41S thus confined in the passage 41R is transported to a radiator 41Q provided at both lateral sides of the plasma display panel 10.

By using the heat pipe mechanism such as the one shown in the construction of FIGS. 15A and 15B, it is no longer necessary to radiate heat at the part where the driver integrated circuit chips are provided, and the plasma display device can be formed with a compact size. Further, a superior efficiency of cooling is achieved. This in turn means that a further increase of mounting density of the driver integrated circuit becomes possible.

Figure 16:
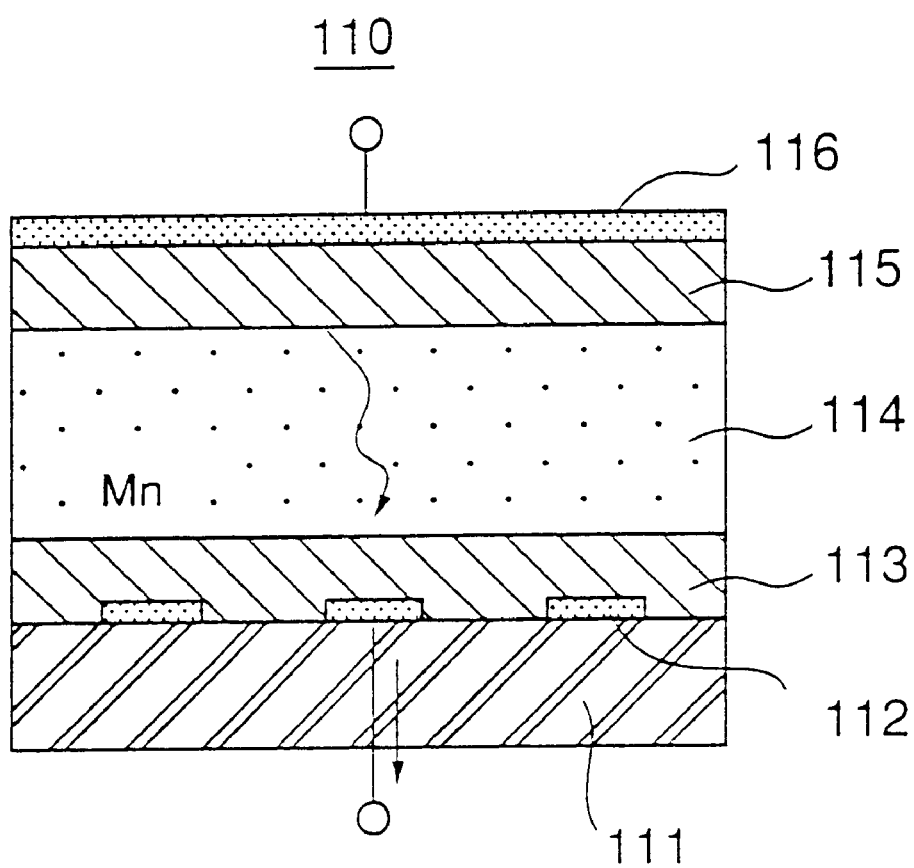
FIG. 16 is a diagram showing the construction of an electro-luminescent display device according to a further embodiment of the present invention.

It should be noted that the construction of the driver part that uses the heat sink block of the present invention is applicable not only to the plasma display devices but also to other light-emitting flat display device such as an electroluminescent (EL) display device 110 represented in FIG. 16.

Referring to FIG. 16, the EL display device 110 is constructed on a glass substrate 111 carrying thereon drive electrode patterns 112, and includes an insulation film 113 provided on the glass substrate 111 so as to cover the drive electrode patterns 112, a light-emitting layer 114 of Mn-doped ZnS formed on the insulation film 113, and an opposing electrode 116 covering the light-emitting layer 114 with an intervening insulation film 115 interposed between the light-emitting layer 114 and the opposing electrode 116.

By applying a drive voltage across the drive electrode patterns 112 and the opposing electrode, a desired light-emission is induced in the light-emitting layer 114.

In the construction of FIG. 16, too, it is necessary to provide a power drive circuitry, and the construction of the power drive circuit including the driver integrated circuit chips and the heat sink block is effective for the efficient dissipation of the heat generated by the driver integrated circuit chips mounted on the heat sink block with high mounting density.

Further, the construction of the power drive circuit of the present invention is applicable also to a liquid crystal display device having a very large screen size or a very large display capability.

Heretofore, the present invention has been described with reference to preferred embodiments. However, the present invention is by no means limited to these preferred embodiments, but various variations and modifications may be made without departing from the scope of the invention.

What is claimed is:

1. A flat display device, comprising:
   a display panel comprising a substrate having a peripheral edge;
   a driver integrated circuit chip adjacent to the display panel and electrically connected thereto; and
   a heat sink, adjacent to the display panel, having an inner peripheral edge disposed adjacent the peripheral edge of the substrate and extending outwardly therefrom, the heat sink carrying thereon the driver integrated circuit chip.

2. A flat display device as claimed in claim 1, wherein the heat sink has a thermal conductivity larger than a thermal conductivity of the display panel.

3. A flat display device as claimed in claim 1, wherein the heat sink further carries thereon a printed circuit board.

4. A flat display device as claimed in claim 1, wherein the heat sink is adhered to the display panel.

5. A flat display device as claimed in claim 1, wherein the heat sink is adhered to an edge of the display panel.

6. A flat display device as claimed in claim 1, wherein the inner peripheral edge of the heat sink comprises a stepped part between first and second portions of the heat sink, the first portion being parallel to and receiving thereon a peripheral bottom surface portion of the substrate of the display panel and the second portion extending outwardly from the peripheral edge of the substrate.

7. A flat display device as claimed in claim 1, wherein the driver integrated circuit chip and the display panel are connected electrically by wire bonding.

8. A flat display device as claimed in claim 1, wherein the driver integrated circuit chip and the display panel are connected electrically by a TAB lead.

9. A flat display device as claimed in claim 1, wherein the display panel is a plasma display panel.

10. A flat display device as claimed in claim 1, wherein the display panel is an electroluminescent display panel.

11. A flat display device as claimed in claim 1, wherein the heat sink includes cooling fins.

12. A flat display device as claimed in claim 1, wherein the heat sink includes a heat pipe.

13. A flat display device, comprising:
    a display panel;
    a driver integrated circuit chip adjacent the display panel and electrically connected thereto; and
    a heat sink mounted to the display panel adjacent to a peripheral portion thereof, the heat sink carrying thereon, and being thermally coupled to, the driver integrated circuit chip and the heat sink having an inner peripheral edge extending along an outer periphery of said display panel.

14. A flat display device as claimed in claim 13, wherein the heat sink has a thermal conductivity larger than a thermal conductivity of the display panel.

15. A flat display device as claimed in claim 13, wherein the heat sink further carries thereon a printed circuit board.

16. A flat display device as claimed in claim 13, wherein the heat sink is adhered to the display panel.

17. A flat display device as claimed in claim 13, wherein the heat sink is adhered to the peripheral edge of the display panel.

18. A flat display device as claimed in claim 13, wherein the heat sink includes a stepped part engaging the peripheral edge of the display panel.

19. A flat display device as claimed in claim 13, wherein the driver integrated circuit chip and the display panel are connected electrically by wire bonding.

20. A flat display device as claimed in claim 13, wherein the driver integrated circuit chip and the display panel are connected electrically by a TAB lead.

21. A flat display device as claimed in claim 13, wherein the display panel is a plasma display panel.

22. A flat display device as claimed in claim 13, wherein the display panel is an electroluminescent display panel.

23. A flat display device as claimed in claim 13, wherein the heat sink includes cooling fins.

24. A flat display device as claimed in claim 13, wherein the heat sink includes a heat pipe.

25. A flat display device as recited in claim 13, wherein:
    the heat sink extends along substantially a full length of the peripheral edge of the display panel; and
    plural driver integrated circuit chips are carried on the heat sink in spaced relationship along substantially the full length of the peripheral edge the display panel.

26. A flat display device as recited in claim 13, wherein the heat sink further comprises a stepped part having a first portion parallel to and receiving thereon a peripheral bottom surface portion of the display panel and a second portion spaced by a transverse edge from the first portion and disposed adjacent the peripheral edge of the display panel.

27. A flat display device as recited in claim 26, wherein:
    the heat sink extends along substantially a full length of the peripheral edge of the display panel; and
    plural driver integrated circuit chips are carried on the heat sink in spaced relationship along substantially the full length of the peripheral edge the display panel.

28. A flat display device as recited in claim 13, wherein:
    the heat sink is disposed with a first main surface adjacent a peripheral portion of the bottom surface of the rear substrate of the display panel, opposite a viewing surface thereof, and has an outer edge substantially aligned with a corresponding peripheral edge of the display panel; and
    the driver integrated circuit chip is mounted on a second main surface, opposite the first main surface, of the heat sink.

29. A flat display device as recited in claim 28, wherein:
    the heat sink extends along substantially a full length of the peripheral edge of the display panel; and
    plural driver integrated circuit chips are carried on the heat sink in spaced relationship along substantially the full length of the peripheral edge the display panel.

30. A flat display device as recited in claim 26, wherein a groove is provided in a surface of the heat sink on which the driver integrated/circuit chip is carried, underlying the driver integrated circuit chip and facilitating access thereto.

31. A flat display device as recited in claim 28, wherein a groove is provided in a surface of the heat sink on which the driver integrated circuit chip is carried, underlying the driver integrated circuit chip and facilitating access thereto.

32. A flat display device as recited in claim 26, wherein a hole extending through the heat sink is provided in a surface of the heat sink on which the driver integrated circuit chip is carried, underlying the driver integrated circuit chip to facilitate access thereto.

33. A flat display device as recited in claim 28, wherein a hole extending through the heat sink is provided in a surface of the heat sink on which the driver integrated circuit chip is carried, underlying the driver integrated circuit chip to facilitate access thereto.

34. A flat display device as recited in claim 26, wherein cooling fins are provided on a surface of the heat sink remote from a rear surface of the display panel.

35. A flat display device as recited in claim 28, wherein cooling fins are provided on a surface of the heat sink remote from a rear surface of the display panel.

36. A flat display device as recited in claim 13, wherein the heat sink is disposed adjacent to and spaced from a peripheral edge of the display panel, respective bottom surfaces of the heat sink and the display panel being substantially in a common plane.

37. A flat display device as recited in claim 36, wherein:
the heat sink extends along substantially a full length of the peripheral edge of the display panel; and
plural driver integrated circuit chips are carried on the heat sink in spaced relationship along substantially the full length of the peripheral edge the display panel.

38. A flat display device as recited in claim 6, wherein:
the heat sink extends along substantially a full length of the peripheral edge of the display panel; and
plural driver integrated circuit chips are carried on the heat sink in spaced relationship along substantially the full length of the peripheral edge the display panel.

39. A flat display device as recited in claim 13, wherein:
the heat sink is disposed with a first main surface adjacent a peripheral portion of a rear surface of the display panel, opposite a viewing surface thereof, and has an outer edge substantially aligned with a corresponding peripheral edge of the display panel; and
the driver integrated circuit chip is mounted on a second main surface opposite the first main surface of the heat sink.

40. A flat display device as recited in claim 38, wherein:
the heat sink extends along substantially a full length of the peripheral edge of the display panel; and
plural driver integrated circuit chips are carried on the heat sink in spaced relationship along substantially the full length of the peripheral edge the display panel.

41. A flat display device as recited in claim 37, wherein a groove is provided in a surface of the heat sink on which the driver integrated circuit chip is carried, underlying the driver integrated circuit chip and facilitating access thereto.

42. A flat display device as recited in claim 38, wherein a groove is provided in a surface of the heat sink on which the driver integrated circuit chip is carried, underlying the driver integrated circuit chip and facilitating access thereto.

43. A flat display device as recited in claim 37, wherein a hole extending through the heat sink is provided in a surface of the heat sink on which the driver integrated circuit chip is carried, underlying the driver integrated circuit chip to facilitate access thereto.

44. A flat display device as recited in claim 38, wherein a hole extending through the heat sink is provided in a surface of the heat sink on which the driver integrated circuit chip is carried, underlying the driver integrated circuit chip to facilitate access thereto.

45. A flat display device as recited in claim 37, wherein cooling fins are provided on a surface of the heat sink remote from a rear surface of the display panel.

46. A flat display device as recited in claim 38, wherein cooling fins are provided on a surface of the heat sink remote from a rear surface of the display panel.

47. A flat display device, comprising:
a display panel of front and rear substrates respectively having a front, viewing surface and a rear surface and contiguous opposing surfaces, the rear substrate extending beyond the periphery of the front substrate and having a peripheral edge;
a driver integrated circuit chip adjacent to the display panel and electrically connected thereto;
a heat sink mounted on a peripheral bottom surface portion of the rear substrate of the display panel and having a peripheral edge aligned with and extending along the peripheral edge of the rear substrate and of a substantially common length therewith, the heat sink carrying thereon the driver integrated circuit chip; and
wirings extending from the driver integrated circuit chip around the common peripheral edges of the heat sink and the rear substrate electrically connected the driver integrated circuit chip to the display panel.

48. A flat display device as claimed in claim 47, wherein the heat sink has a thermal conductivity larger than a thermal conductivity of the display panel.

49. A flat display device as claimed in claim 47, wherein the heat sink further carries thereon a printed circuit board.

50. A flat display device as claimed in claim 47, wherein the heat sink is adhered to the display panel.

51. A flat display device as claimed in claim 47, wherein the heat sink is adhered to the peripheral rear bottom surface portion of the display panel.

52. A flat display device as recited in claim 13, wherein:
the heat sink carries the driver integrated circuit chip on a front surface thereof; and
the heat sink is connected at a rear surface thereof to a peripheral bottom surface portion of the rear surface of the display panel, adjacent the peripheral edge thereof.

53. A flat display device, comprising:
a display panel having front and rear glass substrates, the rear glass substrate having a peripheral portion;
a heat sink mounted on the peripheral portion of the rear glass substrate; and
a driver integrated circuit chip mounted on and thermally coupled to the heat sink and electrically connected to the display panel.

54. A flat display device as recited in claim 53, wherein the heat sink has a first portion extending under a rear surface of the peripheral portion of the rear glass substrate, an interior edge opposing an outer peripheral edge of the rear glass substrate, and a second portion extending laterally outwardly from the interior edge.

55. A flat display device as recited in claim 54, wherein the heat sink carries the driver integrated circuit chip on the second portion.

56. A flat display device, comprising:

a display panel having front and rear glass substrates, the rear glass substrate having a peripheral portion;

a heat sink mounted on the peripheral portion of the rear glass substrate; and a driver integrated circuit chip mounted on and thermally coupled to the heat sink and electrically connected to the display panel, said heat sink having an inner peripheral edge extending along an outer periphery of said rear glass substrate, wherein the heat sink carries the driver integrated circuit chip thereon, and the heat sink is mounted on the peripheral portion of the rear glass substrate such that a bottom surface of the heat sink is attached to a bottom surface of the rear glass substrate.

57. A flat display device, comprising:

a display panel having front and rear glass substrates, the rear glass substrate having a peripheral portion;

a heat sink mounted on the peripheral portion of the rear glass substrate; and a driver integrated circuit chip mounted on and thermally coupled to the heat sink and electrically connected to the display panel, said heat sink having an inner peripheral edge extending along an outer periphery of said rear glass substrate, wherein:

a peripheral portion of the rear glass substrate extends beyond a peripheral edge of the front glass substrate and defines an outer peripheral edge of the display panel; and the heat sink is mounted on the extended peripheral portion of the rear glass substrate.

58. A flat display device as recited in claim 57, wherein the heat sink has an inner edge opposing the outer peripheral edge of the rear glass substrate and extends laterally outwardly therefrom.

59. A flat display device as recited in claim 57, wherein:

the heat sink is disposed on, and adhered to, a rear surface portion of the peripheral portion of the rear glass substrate; and the driver integrated circuit chip is disposed on and thermally coupled to a surface of the heat sink, remote from the rear substrate.

60. A flat display device as recited in claim 1, wherein respective bottom surfaces of the heat sink and the display panel are substantially in a common plane.

* * * * *

UNITED STATES PATENT AND TRADEMARK OFFICE
CERTIFICATE OF CORRECTION

PATENT NO. : 6,774,872 B1
DATED : August 10, 2004
INVENTOR(S) : Toyoshi Kawada et al.

It is certified that error appears in the above-identified patent and that said Letters Patent is hereby corrected as shown below:

Column 12,
Line 12, claim 17 should read:
17. A flat display device as claimed in claim 13, wherein the heat sink is adhered to the peripheral portion of the display panel.
Line 52, claim 28 should read:
28. A flat display device as recited in claim 13, wherein:

the heat sink is disposed with a first main surface adjacent a peripheral portion of the rear bottom surface of the display panel, opposite a viewing surface thereof, and has an outer edge disposed adjacent to a peripheral edge of the display panel; and the driver integrated circuit chip is mounted on a second main surface, opposite the first main surface, of the heat sink.

Column 13,
Line 42, claim 39 should read:
39. A flat display device as recited in claim 13, wherein:

the heat sink is disposed with a first main surface adjacent a peripheral portion of a rear surface of the display panel, opposite a viewing surface thereof, and has an outer edge disposed substantially parallel to a peripheral edge of the display panel; and the driver integrated circuit chip is mounted on a second main surface opposite the first main surface of the heat sink.

Column 14,
Line 15, claim 47 should read:
47. A flat display device, comprising:
a display panel;
a driver integrated circuit chip adjacent to the display panel and electrically connected thereto;
a heat sink mounted on a peripheral rear bottom surface portion of the rear substrate of the display panel and having a peripheral edge extending along the peripheral edge of the display panel, the heat sink carrying thereon the driver integrated circuit chip; and wirings extending from the driver integrated circuit chip around the common peripheral edges of the heat sink and the rear substrate electrically connected the driver integrated circuit chip to the display panel.

Line 50, claim 53 should read:
53. A flat display device, comprising:
a display panel having front and rear glass substrates, the rear glass substrate having a peripheral portion;
a heat sink mounted on the peripheral portion of the rear glass substrate; and
a driver integrated circuit chip mounted on and thermally coupled to the heat sink and electrically connected to the display panel,
said heat sink having an inner peripheral edge extending along an outer periphery of said rear glass substrate.

UNITED STATES PATENT AND TRADEMARK OFFICE
CERTIFICATE OF CORRECTION

PATENT NO. : 6,774,872 B1
DATED : August 10, 2004
INVENTOR(S) : Toyoshi Kawada et al.

It is certified that error appears in the above-identified patent and that said Letters Patent is hereby corrected as shown below:

Column 14 (cont'd),
Line 59, claim 54 should read:

54. A flat display device as recited in claim 55, wherein the heat sink comprises a first portion having the inner peripheral edge disposed adjacent the outer peripheral edge of the rear glass substrate and a second portion, integral with the first portion and extending laterally outwardly from the inner peripheral edge thereof.

Column 15,
Line 1, claim 56 should read:

56. A flat display device, comprising:
a display panel having front and rear glass substrates, the rear glass substrate having a peripheral portion;
a heat sink mounted on the peripheral portion of the rear glass substrate; and
a driver integrated circuit chip mounted on and thermally coupled to the heat sink and electrically connected to the display panel,
said heat sink having an inner peripheral edge extending along an outer periphery of said rear glass substrate, wherein:
the heat sink is mounted on the peripheral portion of the rear glass substrate such that a bottom surface of the heat sink is attached to a bottom surface of the rear glass substrate.

Line 17, claim 57 should read:

57. A flat display device, comprising:
a display panel having front and rear glass substrates, the rear glass substrate having a peripheral portion;
a heat sink mounted on the peripheral portion of the rear glass substrate; and
a driver integrated circuit chip mounted on and thermally coupled to the heat sink and electrically connected to the display panel,
said heat sink having an inner peripheral edge extending along an outer periphery of said rear glass substrate, wherein:
a peripheral portion of the rear glass substrate extends beyond a peripheral edge of the front glass substrate and defines an outer peripheral edge of the display panel.

Signed and Sealed this

Twenty-first Day of December, 2004

JON W. DUDAS
*Director of the United States Patent and Trademark Office*